United States Patent [19]

Artaud et al.

[11] 4,275,655
[45] Jun. 30, 1981

[54] METHOD AND APPARATUS FOR SCREEN PRINTING REGISTERED IMAGES ON OPPOSITE SIDES OF A WEB

[75] Inventors: Gerard P. Artaud; Clarence O. Schrader, both of Santa Ana, Calif.; George W. Reinke, Reno, Nev.

[73] Assignee: The Arnold Engineering Company, Marengo, Ill.

[21] Appl. No.: 5,881

[22] Filed: Jan. 23, 1979

[51] Int. Cl.$^3$ .................... B41F 15/36; B41F 15/08
[52] U.S. Cl. ................................... 101/123; 101/129
[58] Field of Search ............... 101/123, 121, 128.2, 101/129, 114–115

[56] References Cited

U.S. PATENT DOCUMENTS

| 3,102,472 | 9/1963 | Kiecklefer | 101/228 |
| 3,398,680 | 8/1968 | Moskowitz | 101/115 |
| 3,955,501 | 5/1976 | Bubley et al. | 101/123 |
| 4,005,651 | 2/1977 | Sigel | 101/127.1 |
| 4,084,506 | 4/1978 | Nakatani | 101/128.2 |

FOREIGN PATENT DOCUMENTS 743850  1/1956  United Kingdom ............... 101/123

Primary Examiner—Clifford D. Crowder
Attorney, Agent, or Firm—Vincent G. Gioia; John K. Williamson

[57] ABSTRACT

A method and machine are disclosed for screen printing acid-resist mirror inversion images in registration on opposite sides of a metal web with a degree of precision sufficient to permit the incorporation of screen printing techniques in the fabrication of lead frames, electromagnetic core laminations, and other metal plate products by chemical milling processes. A matched pair of upright screen stencils supported in spaced relation on opposite sides of the web is provided with a cooperable pair of squeegees for printing through the image areas of the stencils. The directly opposed squeegees are mounted on a common reciprocable carriage for conjoint movement such that printing on opposite sides of the web is effected synchronously. In preferred forms, a web drive is provided for incrementally advancing the web between the stencils and for holding the web under tension during printing. A screen separator mounted on the carriage in offset relation to the squeegees assures release of the stencils from the web after printing.

24 Claims, 13 Drawing Figures

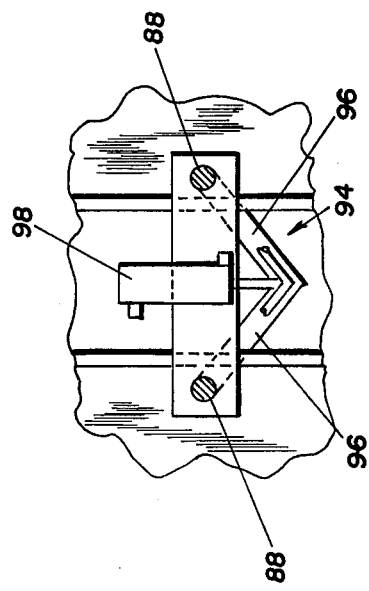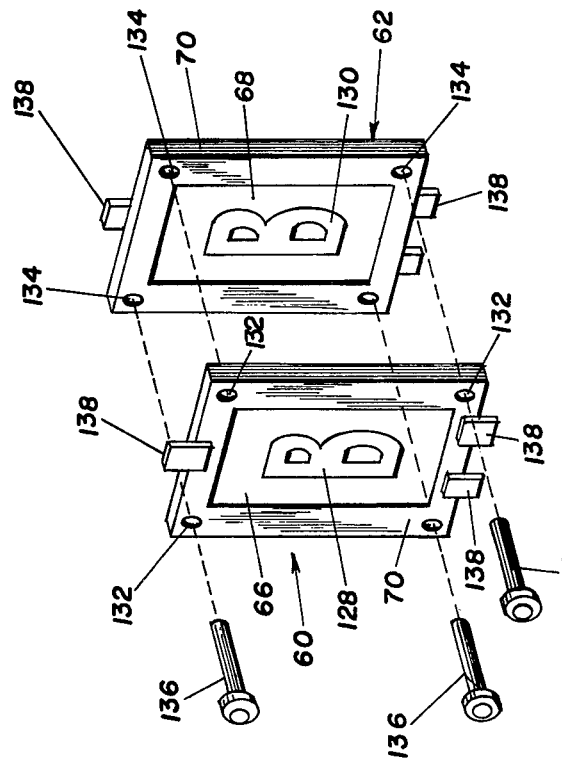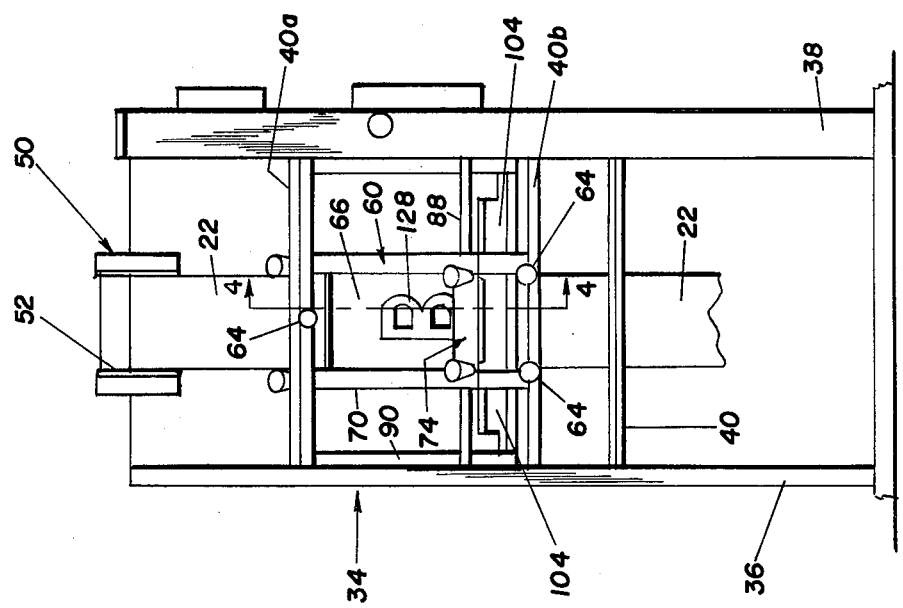

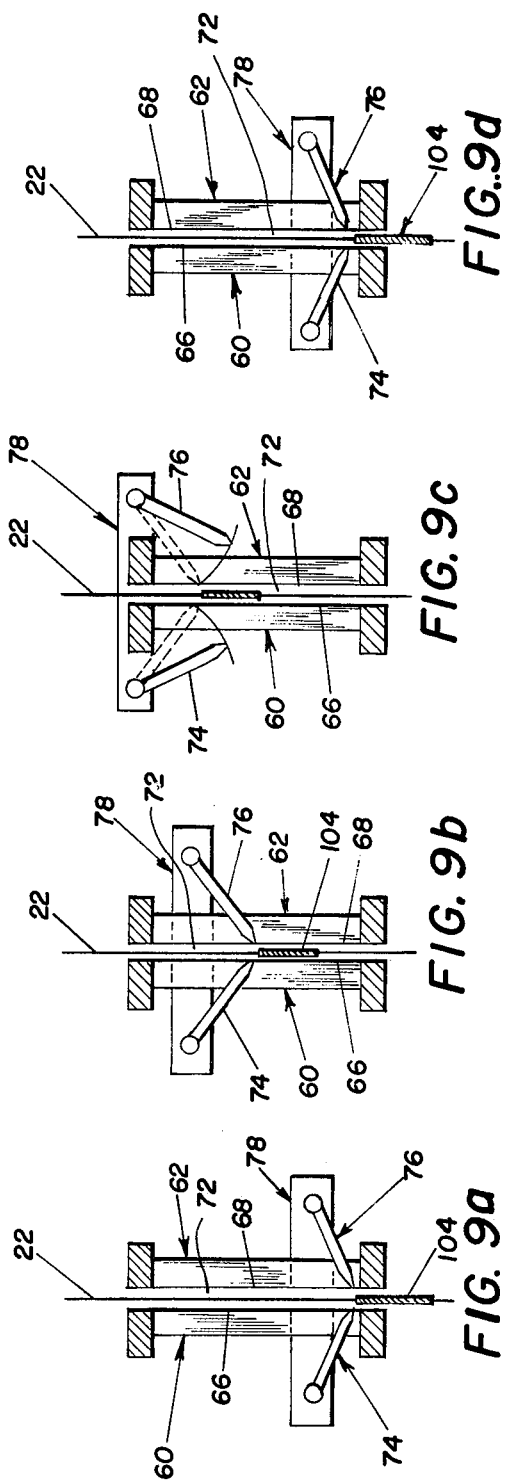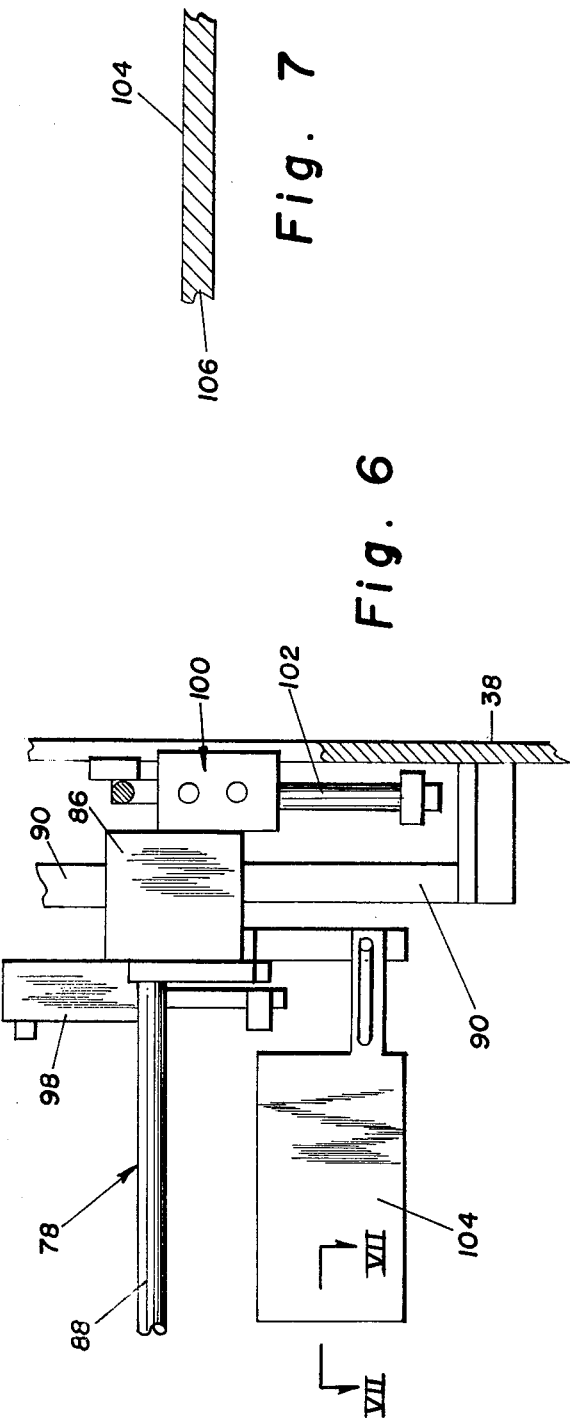

METHOD AND APPARATUS FOR SCREEN PRINTING REGISTERED IMAGES ON OPPOSITE SIDES OF A WEB

TECHNICAL FIELD

This invention relates to screen stencil printing generally and particularly concerns a machine and method for printing mirror inversion images of acid-resist material on opposite sides of a metal web with high-accuracy registration.

BACKGROUND ART

Precision chemical milling metal fabrication techniques have proved extremely useful in the production of certain types of precision electrical hardware such as lead frames for integrated circuits and laminations for the cores of electric motors and transformers. Typically, such lead frames are manufactured using conventional metal stamping techniques which permit high speed production with excellent part repeatability. However, chemical milling is economically competitive with metal stamping processes on "short run" orders where tooling costs become an overriding cost factor. Actually, chemical milled lead frames are believed by many to be superior to those produced by metal stamping techniques, and the chemical milling process offers the additional advantage of permitting subsequent design changes without incurring appreciable tooling rework cost.

The main drawback with the production of lead frames and similar products using chemical milling processes is that this method of manufacture is relatively slow in comparison with other fabrication methods. Because of the nature of the process, parts produced by chemical milling are usually formed from metal sheets in a tedious and cumbersome "batch" process as opposed to the high speed, continuous, coil to coil processing possible with metal stamping techniques.

While numerous attempts have been made to permit continuous process chemical milling, these have heretofore met with failure for one reason or another. The main obstacle in achieving continuous process chemical milling for precision parts resides in the difficultly of applying a suitable acid-resist coating with the degree of accuracy required to produce an acceptable part. Conventional photo sensitive coatings do not lend themselves to continuous processing because of the meticulous care which must be utilized in the application, developing, and handling of these coatings. Although highly effective acid-resist coatings have found extensive use in etching and rough chemical milling operations, such coatings have heretofore proved impractical for use in the fabrication of precision parts because of the difficultly associated with applying such coatings to a metal substrate with a sufficient degree of accuracy.

In the chemical milling of lead frames, for example, mirror inversion images of acid-resist material must be precisely registered on the opposite sides of a metal strip such that there will exist only limited mismatch between opposite sides of the finished part after the strip has been subjected to an acid bath. The degree of mismatch becomes increasingly critical as the number of leads in a frame increases and has proved to be the limiting factor in the fabrication of lead frames using acid-resist coatings. Heretofore, it simply has not been possible to apply a sufficiently thick coating of acid-resist material on opposite sides of a metal web within an allowable range of mismatch between opposed images.

Attempts to overcome the problems alluded to above have been made using conventional offset and rotogravure material on opposite sides of a metal strip. However, such attempts have proved unsuccessful primarily because of the failure to print a coating of sufficient thickness to withstand subsequent acid treatments. Devices for applying a thick coating to the opposite sides of a web are known in the art as represented for example by U.S. Pat. No. 4,063,531, issued to Zitzow, but such devices are of little value in printing opposed images on opposite sides of a web. Moreover, attempts to use printing processes which lay down thicker coatings, as for example in the screen printing process, have heretofore been unsuccessful due to inherent inferior printing quality and unacceptable mismatch between opposed images.

DISCLOSURE OF INVENTION

The invention disclosed herein comprises a method and apparatus for screen printing opposed images on opposite sides of a metal web with a sufficient degree of registration accuracy to permit fabrication of lead frames and similar products on a continuous, coil to coil basis using chemical milling processing.

The invention provides for synchronous screen printing utilizing a pair of opposed, matched stencils in cooperable engagement with a pair of respective printing squeegees mounted for conjoint reciprocation across the stencils. Preferably, the screens are disposed in parallel, upright planes in laterally spaced relation to define a printing zone adapted to receive a vertical stretch of metal web.

A screen separator reciprocates in unison with the squeegees within the printing zone to provide positive separation between the stencils and the metal web after printing. To this end, a web support holds the stretch of web within the printing zone under tension to maintain the proper spacing from the stencils.

BRIEF DESCRIPTION OF DRAWING

FIG. 2 is a front elevational view of the printing unit of the printer shown in FIG. 1;

FIG. 5 is an enlarged, fragmentary, detail view showing the squeegee control assembly for the printing unit illustrated in FIGS. 2 and 3;

FIG. 6 is an enlarged, fragmentary, front elevational view of the printing unit showing details of construction of the squeegee carriage;

FIG. 7 is an enlarged, fragmentary, cross-sectional view taken along line 7—7 of FIG. 6;

FIG. 8 is an enlarged, perspective view of the screen stencils of the printing unit;

FIG. 9a is a schematic of the printing unit showing the squeegees in a print ready position;

FIG. 9b is a schematic as in FIG. 9a, showing the squeegees at one point in their sweep across the stencils;

FIG. 9c is a schematic as in FIG. 9a, showing the squeegees retracted at the end of their sweep;

FIG. 9d is a schematic as in FIG. 9a, showing the squeegees returned to the print ready position.

BEST MODE FOR CARRYING OUT THE INVENTION

Figure 1:
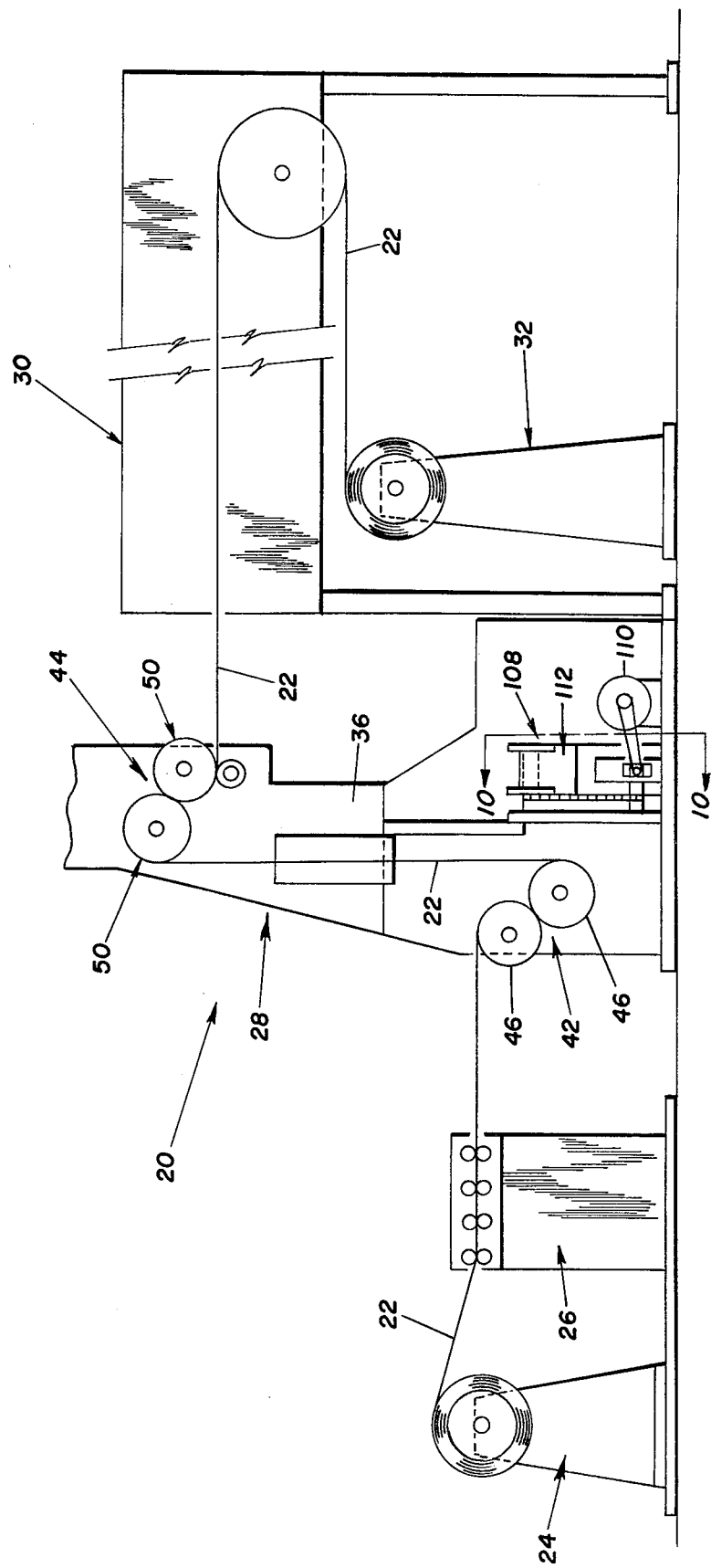
FIG. 1 is a side elevational view of a screen printer constructed in accordance with the principles of the present invention.

In FIG. 1 there is shown a continuous double screen printer 20 adapted to print mirror inversion images in registration on opposite sides of a metal web 22 in continuous, coil to coil fashion. The basic components of the printer 20 include in sequential order: a coil support 24, a coil straighener 26, a printing unit 28, a drying oven 30, and a coil rewind 32.

With the components of the printer 20 arranged as shown in FIG. 1, the metal web 22 is carried in coil form on the coil support 24 and extends therefrom through the coil straightener 26 for removal of any coil set which may be present in the web 22. From the straightener 26, the web 22 passes through the printer unit 28 where opposed images of acid-resist coating are successively printed on opposite sides of the web 22 in manner to be described. The web 22 then is advanced through the drying oven 30 for curing of the acid-resist coating and finally recoiled on the rewind 32. In this latter regard, it may be desirable to recoil the web 22 simultaneously with a web of silicon-coated paper or other protective substrate on the rewind 32 to protect the images printed on the web 22 against scratching or other damage.

Though the printer 20 is believed to be a unique combination in itself, it is understood that the coil support 24, straightener 26, drying oven 30, and rewind 32, are components which are generally known in the art, finding extensive use in processing equipment for metal webs. Accordingly, these components will not be further explained, and only the printing unit 28 will be described in greater detail.

The printing unit 28 has a stationary framework 34 comprising a pair of upright, parallel, laterally spaced sidewalls 36, 38 and a number of cross numbers 40 extending between the sidewalls 36, 38 to rigidify the framework 34. The construction of the framework 34 is such that it supports the various elements described herein without appreciable deflection.

A web support for the metal web 22 is collectively defined by a lower roller train 42 and an upper roller train 44 each carried on the framework 34 in spanning relation between the sidewalls 36, 38. The roller train 42 comprises a pair of elongate cylindrical rolls 46 journaled to the sidewalls 36, 38 for rotation about parallel, offset axes in a manner to define a web-receiving nip 48.

The upper roller train 44 comprises a pair of identical rolls 50 journaled to the sidewalls 36, 38 in a manner similar to the mounting of the rolls 46. However, the rolls 50 are not cylindrical along their entire length, but rather present a pair of opposed web engaging shoulders 52 adapted to contact only the outer edge of the web 22. The shoulders 52 of each roll 50 are shiftable toward and away from one another to accommodate the webs of various width. Additionally, the upper train 44 has a pair of cylindrical riders 54 coaxially supported on a shaft 56 which in turn is supported on the framework 34 in parallel relation to the axes of the rolls 50. The riders 54 are shiftable along the shaft 56 and are adapted to be positioned in cooperable engagement with the shoulders 54 of one roll 50 to define a web-receiving nip 58.

Though not shown in the drawing, it is to be understood that the roller trains 42, 44 are drivingly intercoupled for in unison operation. The trains 42, 44 are powered by a conventional intermittent drive (not shown) in a manner to accomplish incremental advancement of the web 22 as is known in the art. It is important to note that the diameters of the shoulders 52 are slightly greater than the diameters of the rolls 50 such that the web 22 is maintained under constant tension along the stretch between the trains 42, 44. In preferred forms, the web 22 is disposed in a substantially vertical plane intermediate the trains 42, 44 as shown for example in FIG. 3.

Figure 4:
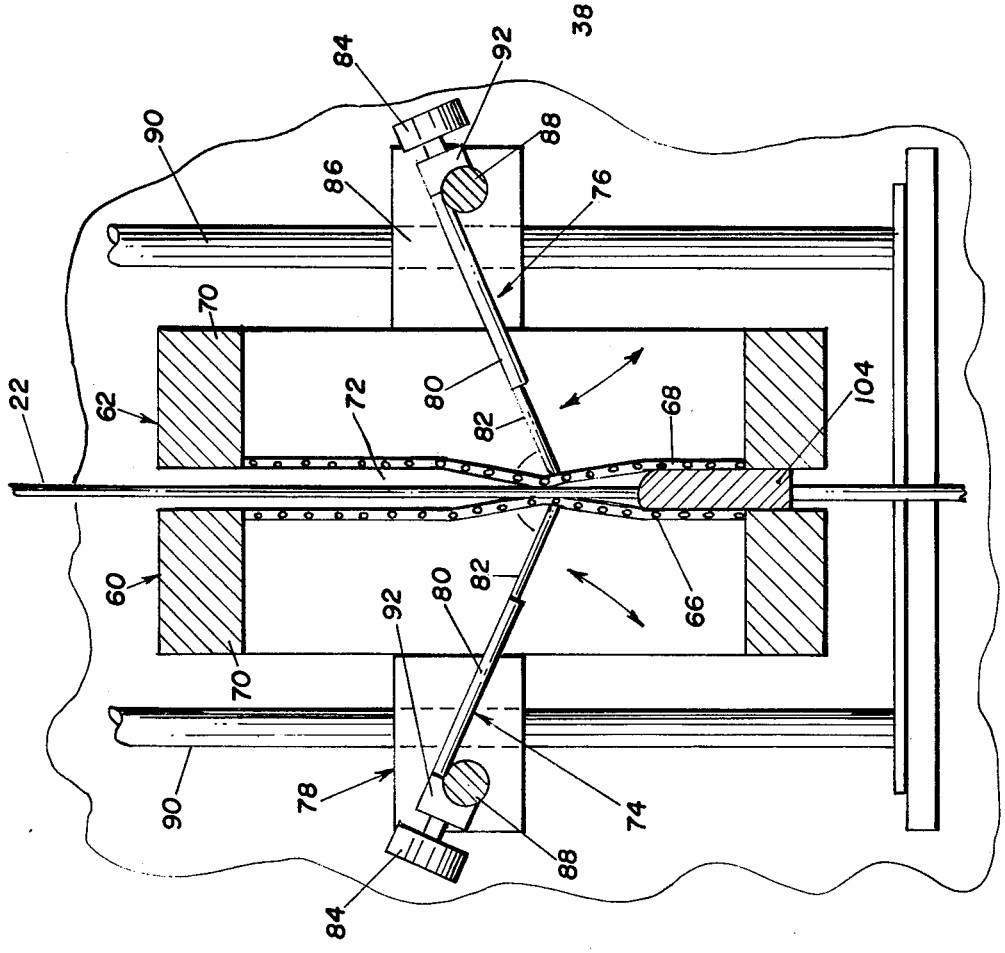
FIG. 4 is an enlarged, fragmentary, cross-sectional view of the printing unit taken along line 4—4 of FIG. 2.

A pair of matched screen stencils 60 and 62, shown in detail in FIG. 8 and described more fully hereinbelow, are removably attached to a pair of spaced cross-members 40a, 40b by releasable clamps 64 (shown only in FIG. 2). The stencils 60, 62 have respective pliable, printing membranes 66, 68 each supported on a rigid rectangular frame 70. As shown in FIG. 4, the stencils 60, 62 are supported in opposed relation with the membranes 66, 68 disposed in vertical offset planes to define a printing zone 72 therebetween. The relationship between the cross-members 40a, 40b and the web support defined by the trains 42, 44, is such that the web 22 passes through the printing zone 72 in substantially parallel relation to the membranes 66, 68 and approximately equal distance therefrom.

A pair of opposed squeegees 74, 76 are removably mounted on a reciprocable carriage 78 for engagement with, and sweeping movement across, respective printing membranes 66, 68 as shown for example in FIG. 4. The squeegees 74, 76 are of conventional construction, each having a rigid upper body 80 and a resilient lower blade 82 supported on the body 80 and adapted to printingly engage a membrane 60, 68. Additionally, each squeegee 74, 76 has a set of threaded fasteners 84 for releasable mounting of the squeegees to the carriage 78 in a manner to be described.

As best shown in FIGS. 2, 4, and 6, the carriage 78 comprises a pair of spaced slide blocks 86 interconnected by a pair of fore and aft spaced, horizontally extending, axially rotatable shafts 88. Each block 86 is shiftably mounted on a pair of vertically extending guide rods 90, which pairs are in turn rigidly attached to the respective sidewalls 36, 38. Hence, it will be appreciated that the carriage 78 is shiftable along a recipical path of travel extending the full height of the stencils 60, 62.

Each shaft 88 has a pair of spaced mounts 92 adapted to receive the fasteners 84 for attachment of the squeegees 74, 76 as shown in FIG. 4. Attention is directed to the fact that the shafts 88 are at all times disposed at equal vertical positions during reciprocation of the carriage 78. Thus, the blade 82 of squeegee 74 contacts the membrane 66 of stencil 69 at a point directly opposite the contact between the blade 82 of squeegee 76 and the membrane 68 of stencil 62. This is an important feature of the present invention and directly contributes to synchronous printing of the web 22 which has been found necessary to obtain the desired degree of registration accuracy.

Considering now FIG. 5, there is shown a toggle mechanism 94 adapted to control the angular position of the squeegees 74, 76 relative to the respective membranes 66, 68. The mechanism 94 comprises a crank 96 on each shaft 88, and a double acting air cylinder 98 attached to the cranks 96 in a manner to effect in unison shifting thereof. Such shifting of the cranks manifestly causes corresponding rotation of the shafts 88 with resultant change in angular position of the squeegees 74, 76. This rotational movement is shown schematically in FIG. 9, it being noted that when the cylinder 98 is disposed with its rod in the extended position as illustrated in FIG. 5, the squeegees 74, 76 are rotated away from their respective membranes 66, 68 as shown in the third sequence of FIG. 9. Conversely, when the rod of the cylinder 98 is in its retracted position the squeegees 74, 76 are disposed as shown in FIG. 4.

The operation of cylinder 98 is determined by a pneumatic slide valve 100 coupled to a source of pressurized air (not shown). The actuating plunger 102 of the slide valve operates to shift air flow to the cylinder 98 at the top and bottom of the reciprocal path of travel of the carriage 78. The connection (not shown) between the valve 100 and the cylinder 98 is such that the squeegees 74, 76 are shifted into engagement with the respective membranes 66, 68 at the bottom of the carriage stroke and remain in engagement through the up stroke of the carriage 78, whereupon the plunger 102 shifts the slide valve 100 to actuate the cyclinder 98 for shifting of the squeegees 74, 76 to the disengaged position illustrated in the third sequence of FIG. 9. This position of the squeegees is maintained during the full down or return stroke of the carriage 78.

Each of the blocks 86 has a spacer 104 adjustably mounted thereon in spaced relation beneath the rotatable shafts 88. The spacers 104 collectively define a stencil separator operable to positively disengage the membranes 66, 68 from the web 22 after printing. In this connection, the membranes 66, 68 are locally deflected by the squeegees 74, 76 as shown in FIG. 4 during the up stroke or printing stroke of the carriage 78. The stencil separator defined by the spacers 104 overcomes any tendency of the membranes 66, 68 to remain in contact with the web 22 after passage of the squeegees 74, 76 due to the inherent tackiness of the printing ink. As shown in FIG. 7, each spacer 104 has a groove 106 (shown only in FIG. 7) formed in its inner margin for receiving a respective lateral edge of the web 22. By this construction, the spacers 104 not only serve jointly as a stencil separator, but also operate to maintain the web 22 in precise position relative to the stencils 60, 62 in the critical stretch along the printing zone 72.

Though not shown, it is to be understood that the printing unit 28 includes apparatus for automatically delivering ink to the stencils 60, 62 in a manner well known in the art. Any type of ink formulated for screen printing is suitable for use in the printing unit 28, though special acid resist ink must, of course, be used when preparing the web 22 for subsequent chemical milling operations.

Figure 3:
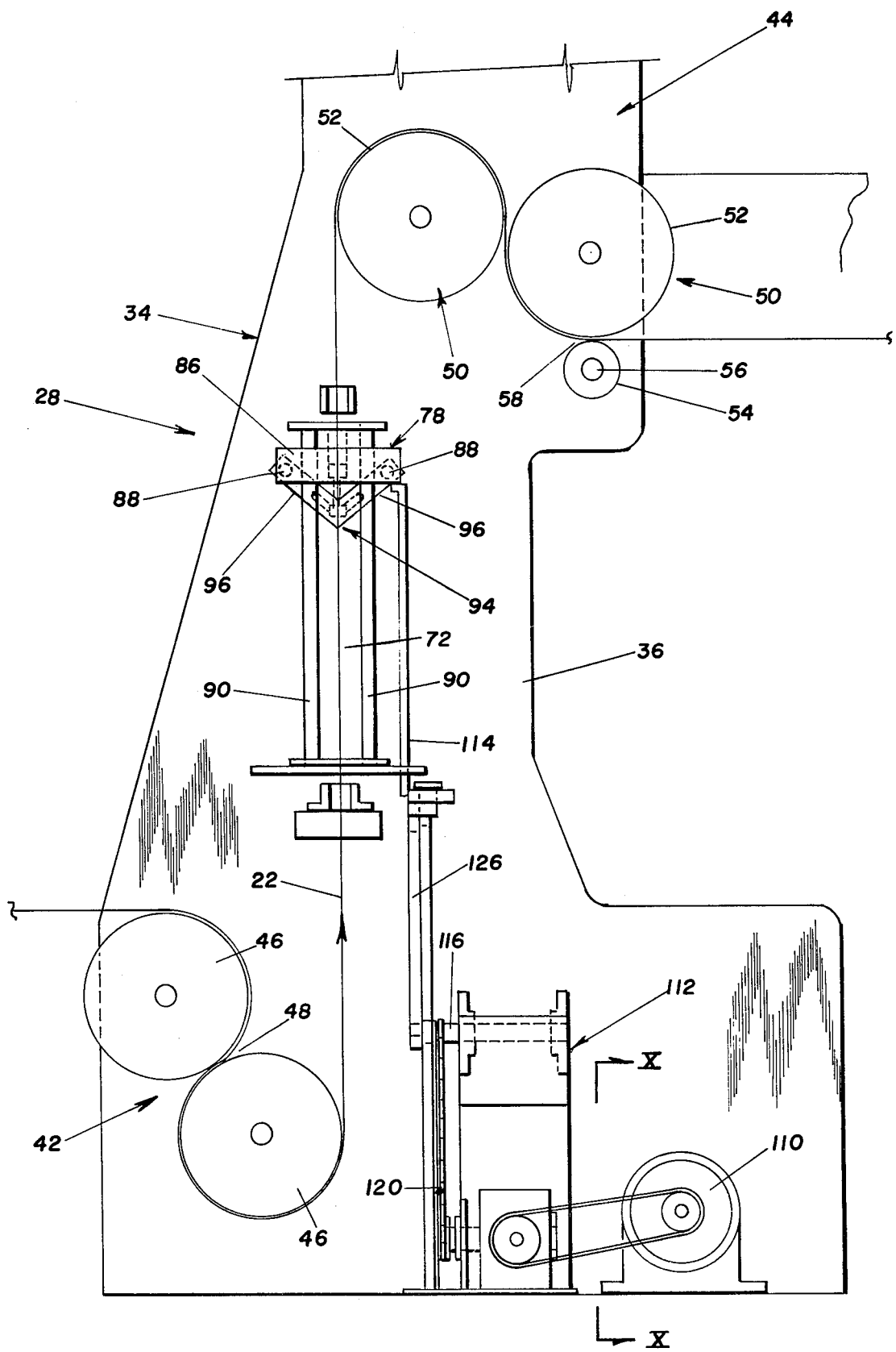
FIG. 3 is an enlarged, side elevational view of the printing unit with portions thereof removed to reveal details of construction.
Figure 10:
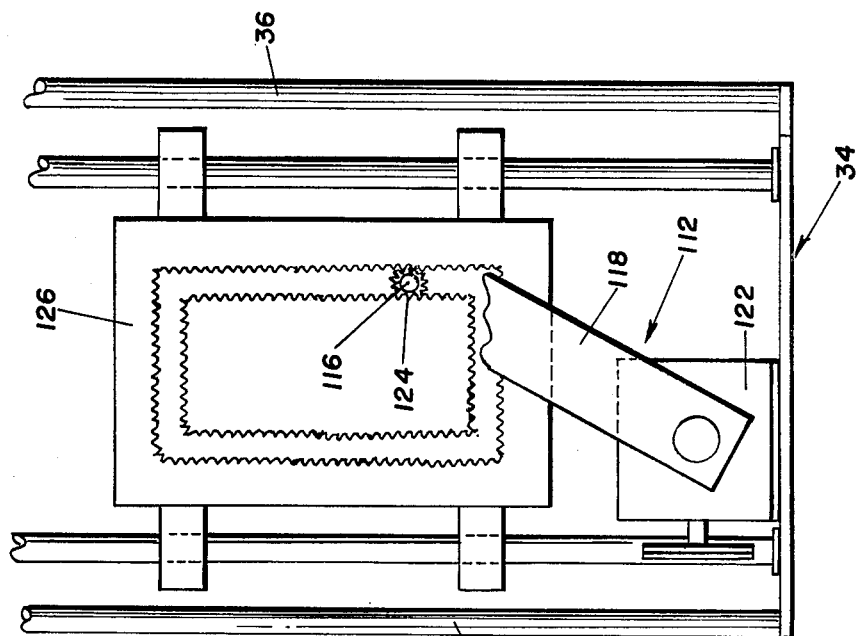
FIG. 10 is an enlarged, fragmentary, cross-sectional view taken along the line 10—10 of FIG. 1.

A drive mechanism 108 for reciprocating the carriage 78 is shown in FIGS. 3 and 10. The mechanism 108 comprises an electric motor 110 coupled via a transmission device 112 to a drive link 114 which in turn is attached to the carriage 78. The transmission device 112 operates to convert the rotary movement of the motor 110 to reciprocal movement for the link 114.

The device 112 includes a jack shaft 116 supported on a transversely swingable arm 118 and drivingly coupled with the motor 110 via a chain in sprocket assembly 120 and a right angle gear reducer 122. A spur gear 124 on the jack shaft 116 is received within an endless raceway formed in a slide plate 126 as shown in FIG. 10. The plate 126 is shiftably supported on the framework 34 for reciprocal up and down movement and is attached to the drive link 114 for transmitting motion thereto. It will be appreciated that rotation of the jack shaft 116 and spur gear 124 via the motor 110 will cause up and down movement of the plate 126 and link 114 as the gear 124 travels around the raceway formed in the plane 126. By virtue of the fact that the vertical stretches of the raceway are rectilinear, there is assured substantially constant-velocity motion of the carriage 78 during travel along its up and down strokes. Such constant velocity is believed to contribute to the improved quality printing obtained with the unit 28 of the present invention.

Turning now to FIG. 8, there are shown the details of construction of the stencils 60, 62. It is noted that the printing membrane 66, which is normally ink impervious, has an open, ink transmissive image area 128 which corresponds to the image desired to be imprinted on the web 22. Similarly, the normally ink impervious membrane 68 of stencil 62 has an open, ink transmissive image area 130. Preferably, the membranes 66, 68 are constructed of fine mesh stainless steel screen provided with a nickel overcoat, the areas 128, 130 being defined by portions of the screen having no nickel coating. Such construction provides the required high degree of stencil stability required for precision dual screen printing. Fabrication techniques for screens of this type are disclosed in U.S. Pat. Nos. 3,482,300 and 3,759,799, both issued to George W. Reinke.

The image areas 128, 130 are mirror inversions of one another such that when the screen stencils 60, 62 are disposed face to face as shown in FIG. 8, the images 128, 130 may be placed in exact registration. To this end, there are provided apertures 132 in the frame 70 of stencil 60 matched drilled to corresponding apertures 134 in the frame 70 of stencil 62, and mating pins 136 adapted to be received within the apertures 132, 134 for holding the images 128, 130 in perfect registration.

In forming the apertures 132, 134, the image areas 128, 130 are first disposed in exact registration and the frames 70 of the stencils 60, 62 are locked together in this registered position by clamping or other means. The apertures 132, 134 are then drilled in the frames 70 such that realignment of the aperture guarantees automatic registration of the image areas 128, 130. In this regard, the areas 128, 130 are returned to the exact same relative positions each time the apertures are brought into alignment.

Inherently, the service life of the membranes 66, 68 is significantly less than that of the frames 70. In instances where it is desired to reuse the frames 70, after membranes 66, 68 have become worn, provision must be made for adjusting the relative positions of the apertures 132, 134. For example, the frame 70 of stencil 60 might have adjustable aperture-defining means, such as shiftable ears (not shown in the drawing), for permitting selective repositioning of the apertures 132 relative to the frame 70; the corresponding apertures 134 would remain permanently fixed relative to the frame 70 of the stencil 62. Thus, the slave stencil 60 can be accurately registered with the master stencil 62 when the frames 70 are provided with new membranes 66, 68. In practice, the above-described construction has proved particularly valuable due to the fact that it is virtually impossible to position new membranes 66, 68 on the frames 70 with image areas 128, 130 in precise registration.

Each stencil 60, 62 is provided with mounting ears 138 adapted to contact the cross members 40a, 40b when the screens are mounted in the printing unit 28.

In operation, the web 22 is threaded through the printer 20 as shown in FIG. 1. At the onset of the printing cycle, spur gear 124 is disposed in the uppermost stretch of the endless raceway in slide plate 126 such that the carriage 78 is located at the lower end of its path of travel. With the carriage 78 so positioned, the lower blades 82 of the squeegees 74, 76 are held in printing engagement with the respective membranes 66, 68 by virtue of the influence of the cylinder 98 as determined by slide valve 100.

As the spur gear 124 moves from the uppermost stretch of the raceway in plate 124, carriage 78 is caused to begin its upward or printing stroke. During this stroke, acid resist ink supplied to the respective stencils in metered amounts by conventional means is swept across the membranes 66, 68 by the blades 82. This action, of course, causes ink to be forced through the image areas 128, 130 to print a desired image on each side of the web 22. As shown in FIGS. 4 and 9, the squeegees 74, 76 are carried in direct opposition on the carriage 78 such that printing on opposite sides of the web occurs synchronously during the upward stroke of the carriage 78.

When the carriage 78 reaches the top of its stroke (i.e., when spur gear 124 moves into the upper horizontal stretch of the endless raceway), the squeegees 74, 76 are caused to swing away from the stencils 60, 62 as shown in the third sequence of FIG. 9 by the action of cylinder 98 in the manner previously explained. The carriage briefly dwells in this position as the gear 124 moves through the upper raceway stretch and then begins a downward or return stroke in response to movement of the gear 124 into the other vertical stretch of the raceway. Upon return of the carriage 78 to its lowermost position, the squeegees 74, 76 are returned to their stencil-engaging positions by the cylinder 98 and the unit 28 is set for the next printing cycle.

The intermittent drive for the trains 42, 44 is timed to the drive mechanism 108 for the carriage 78 in any known manner such that during the return stroke of the carriage 78, the web 22 is advanced an increment sufficient to expose unprinted areas of the web 22 to the printing zone 72. Throughout the printing stroke of the carriage 78, the web 22 is held at rest to promote improved printing quality.

The above described operations are repeated successively until the entire web 22 is printed with the desired matched images. The printed web 22 is progressively rewound on the rewind 32 after passage through the oven 30, and then removed for subsequent processing.

INDUSTRIAL APPLICABILITY

As previously discussed, the screen printer 20 disclosed herein is particularly suited for printing mirror inversion images of acid resist coatings on opposite sides of a metal web in preparation for the fabrication of lead frames or other precision electrical components using chemical milling techniques. Additionally, the present invention finds application in the production by chemical milling of virtually any type of metal plate product.

The method and apparatus of the present invention offer several significant advantages over prior art processing techniques and machines. The instant invention permits high speed production of chemical milled parts such as lead frames using continuous, coil to coil operation. Hence, for the first time, chemical milling may become cost competitive with metal stamping in the high volume fabrication of precision metal parts.

We claim:

1. Apparatus for screen printing mirror inversion images in registration on opposite sides of a web of material, said apparatus including;

a matched pair of ink-receiving screen stencils each presenting a flat printing membrane having an open image area permitting ink transfer therethrough, said image areas being mirror inversions of one another;

said pair of stencils being provided with register means for holding said images in mutual registration;

a stationary framework fixedly supporting said stencils with said membranes juxtapositioned in parallel, laterally spaced relation to define a printing zone therebetween;

means for supplying ink to said stencils;

a web support adapted to position said web such that it extends through said printing zone in parallel relation to said flat membranes generally equidistant therefrom; a squeegee assembly including a unitary one-piece carriage mounted on said framework adjacent said stencils for shifting movement along a path of travel extending generally parallel to said web and said membranes, and a pair of opposed squeegees each mounted on said carriage and each normally in printing engagement with one of said membranes outboard of said printing zone;

means for shifting said carriage from a first position to a second position along said path of travel while said web is stationary whereby to conjointly sweep said squeegees across said membranes such that opposite sides of the web are printed synchronously; and means to lift said squeegees from said membranes, said means for shifting being operable when said squeegees are lifted from said membranes to move said carriage from said second position to said first position.

2. Apparatus as claimed in claim 1, said sweeping means including a mechanism for reciprocating said carriage to move said squeegees along a unidirectional printing stroke and an oppositely directed return stroke, said carriage having means for disengaging said squeegees from respective said membranes during said return stroke.

3. Apparatus as claimed in claim 2, said mechanism being operable to move said squeegees through said printing stroke at a substantially uniform rate of travel.

4. Apparatus as claimed in claim 1, said membranes being disposed in substantially upright planes, said web drive comprising a pair of vertically spaced, web-engaging roller trains mounted on said framework respectively above and below said printing zone and adapted to support said web therebetween in an upright position parallel to said membranes.

5. Apparatus as claimed in claim 4, said web drive being adapted to advance said web in an upwardly direction through said printing zone.

6. Apparatus as claimed in claim 1, each of said stencils having a frame around its respective printing membrane, said register means comprising means for interlocking the frames of said stencils.

7. The invention of claim 6, said interlocking means including a registration set comprising:
- an aperture in the frame of each of said stencils, said apertures being correspondingly located relative to respective said image areas; and
- an alignment pin adapted to be coaxially received within said apertures.

8. The invention of claim 7, said interlocking means having four of said registration sets.

9. The invention of claim 6, said membranes being constructed of wire mesh provided with an overcoating.

10. The invention of claim 9, said overcoating being metal.

11. Apparatus for screen printing mirror inversion images in registration on opposite sides of a web of material, said apparatus including;
- a matched pair of ink-receiving screen stencils each presenting a printing membrane having an open image area permitting ink transfer therethrough, said image areas being mirror inversions of one another;
- said pair of stencils being provided with register means for holding said images in mutual registration;
- a framework supporting said stencils with said membranes juxtapositioned in parallel, laterally spaced relation to define a printing zone therebetween;
- means for supplying ink to said stencils;
- a web support adapted to position said web such that it extends through said printing zone in parallel relation to said membranes generally equidistant therefrom;
- a pair of opposed squeegees mounted for sweeping movement across respective said membranes in printing engagement therewith outboard of said printing zone;
- means for conjointly sweeping said squeegees across said membranes whereby to print opposite sides of the web synchronously,
- said sweeping means including a common carriage for said squeegees;
- a mechanism for reciprocating said carriage to move said squeegees along a unidirectional printing stroke and an oppositely directed return stroke, said carriage having means for disengaging said squeegees from respective said membranes during said return stroke; and
- a stencil separator mounted for movement with said carriage through said printing zone, between said membranes said separator being disposed to trail the squeegees during said printing stroke, and being of sufficient thickness to engage the membranes and separate the latter from the web after passage of said squeegees.

12. Apparatus as claimed in claim 11, said separator being disposed wholly without the portion of said printing zone intermediate said image areas.

13. A method of stencil printing mirror inversion images in registration on opposite sides of an opaque web, comprising the steps of:
- incrementally advancing the web between a pair of parallel, laterally spaced screen stencils having exactly registered image areas each representing a miror inversion of the other;
- providing the stencils with printing ink and engaging each stencil at the same relative location with respective squeegees;
- conjointly sweeping said squeegees across the stencil while the web is at rest to print each side of the web synchronously; and
- passing a spacer between the stencils in trailing relation to said squeegees during said sweeping step to engage and separate the membranes from the web after passage of the squeegees.

14. The method of claim 13, said sweeping step comprising moving said squeegees rectilinearly at a substantially constant rate of travel.

15. The method of claim 13; and placing said web under tension during said sweeping step.

16. The method of claim 13, said stencils and web being disposed in substantially upright planes during said sweeping step.

17. The method of claim 16, said web being equidistant from said screens during said sweeping step.

18. The method of claim 16, said web being moved vertically upwardly during said advancing step.

19. The method of claim 13, said stencils being held stationary during said advancing step.

20. In a screen stencil printing apparatus adapted to print images on opposite sides of a web of material, the improvement comprising:
- a pair of juxtaposed, parallel, laterally spaced screen stencils presenting a printing zone therebetween adapted to receive said web;
- a pair of reciprocable squeegees each printingly engaging a respective said stencil outboard of said printing zone; and
- means for conjointly reciprocating said squeegees to effect printing on opposite sides of said web synchronously; and
- a stencil separator movable with said squeegees in offset relation thereto, said separator being disposed to pass between said stencils for maintaining the spacing therebetween.

21. The improvement of claim 20, said stencils being disposed in upright planes.

22. The improvement of claim 20, said squeegees being reciprocable along a vertical path of travel.

23. The improvement of claim 20, said reciprocating means moving said squeegees along a unidirectional printing stroke and an oppositely directed return stroke, said reciprocating means being operable to move the squeegees at a constant speed through said printing stroke.

24. The improvement of claim 20; said web support including a web drive adapted to apply tension to the web in said printing zone.

* * * * *